(12) United States Patent
Pfaffinger et al.

(10) Patent No.: US 8,385,564 B2
(45) Date of Patent: Feb. 26, 2013

(54) AMPLIFIER THERMAL MANAGEMENT

(75) Inventors: Gerhard Pfaffinger, Regensburg (DE); Andreas Suess, Straubing (DE)

(73) Assignee: Harman Becker Automotive Systems GmbH, Karlsbad (DE)

( * ) Notice: Subject to any disclaimer, the term of this patent is extended or adjusted under 35 U.S.C. 154(b) by 1610 days.

(21) Appl. No.: 11/741,479

(22) Filed: Apr. 27, 2007

(65) Prior Publication Data
US 2007/0262820 A1    Nov. 15, 2007

(51) Int. Cl.
*H03G 3/00*   (2006.01)
*H03G 11/00*  (2006.01)
*H04R 29/00*  (2006.01)

(52) U.S. Cl. .......... 381/107; 381/104; 381/59; 381/120; 381/55; 330/256

(58) Field of Classification Search .............. 381/120, 381/58, 59, 96, 104, 105, 107, 108, 109, 381/55; 330/289, 2, 256, 266, 272
See application file for complete search history.

(56) References Cited

U.S. PATENT DOCUMENTS

| 4,742,312 | A |   | 5/1988 | Osburn et al. ............... 330/298 |
| 5,519,886 | A | * | 5/1996 | Gilbert et al. .............. 455/115.1 |
| 5,533,132 | A |   | 7/1996 | Button ........................ 381/90 |
| 6,269,251 | B1 |   | 7/2001 | Kim ............................. 455/522 |
| 6,336,080 | B1 |   | 1/2002 | Atkinson ..................... 702/132 |
| 6,494,381 | B2 | * | 12/2002 | Bulthuis ...................... 236/49.3 |
| 6,879,929 | B2 | * | 4/2005 | Gauthier et al. ............. 702/132 |
| 7,328,040 | B2 |   | 2/2008 | Nakayama |
| 7,672,463 | B2 | * | 3/2010 | Park et al. ...................... 381/55 |
| 7,840,015 | B1 | * | 11/2010 | Melanson et al. ............ 381/107 |
| 7,974,743 | B2 | * | 7/2011 | Nakashima et al. .......... 700/299 |
| 8,081,455 | B2 | * | 12/2011 | Sano et al. ..................... 361/695 |
| 2002/0158688 | A1 | * | 10/2002 | Terosky et al. ................ 330/129 |
| 2005/0111669 | A1 |   | 5/2005 | Park et al. ...................... 381/58 |
| 2005/0136872 | A1 |   | 6/2005 | Yoshizawa et al. |
| 2008/0218631 | A1 | * | 9/2008 | Suzuki ......................... 348/462 |

FOREIGN PATENT DOCUMENTS

| EP | 0596208    | 8/1993  | ................ 1/52 |
| JP | 58176416   | 11/1983 |
| JP | 61195110   | 12/1986 |
| JP | 2001168646 | 6/2001  |
| JP | 2001274634 | 10/2001 |
| JP | 2003078356 | 3/2003  |
| JP | 2003-209449 | * 7/2003 |
| JP | 2004112707 | 4/2004  |

* cited by examiner

*Primary Examiner* — Xu Mei
(74) *Attorney, Agent, or Firm* — O'Shea Getz P.C.

(57) ABSTRACT

A thermally regulated amplifier system includes an amplifier unit, a temperature-sensing unit and a controller. The amplifier unit includes a power amplifier that has an adjustable gain function. The controller receives temperature readings from the temperature-sensing unit, computes the gain G(n) of the amplifier unit, and provides the computed gain of the amplifier G(n) to the power amplifier unit.

18 Claims, 11 Drawing Sheets

| Output Power, $P_{out}$ (Watt) | Start Time (Second) | End Time (Second) |
|---|---|---|
| 25.0 | 0 | 2000 |
| 8.0 | 2000 | 3000 |
| 0.8 | 3000 | 7000 |
| 24.0 | 7000 | 9000 |
| 16.0 | 9000 | 10000 |

AMPLIFIER THERMAL MANAGEMENT

1. CLAIM OF PRIORITY

This patent application claims priority to European Patent Application serial number 06 008 798.8 filed on Apr. 27, 2006.

2. FIELD OF THE INVENTION

This invention relates to thermal management of an amplifier.

3. RELATED ART

Audio amplifiers typically automatically shutdown when the amplifier temperature becomes too high. When used for entertainment, this interrupts the audio presentation. To circumvent this, disc jockeys may have several power amplifiers so they can switch to a second amplifier when the first amplifier becomes too hot. However, this entails additional capital cost, larger storage space and increases the transportation burden.

U.S. Pat. No. 5,533,132 shows the use of acoustic air movement in a loudspeaker system to dissipate heat in the system. U.S. Pat. No. 6,336,080 discloses thermal management of computers that uses a table of desired states. However, both prior art patents fail to disclose a comprehensive technique of thermal management of an amplifier system.

Therefore, there is a need for an improved amplifier thermal management technique.

SUMMARY OF THE INVENTION

A thermally regulated amplifier system includes an amplifier unit, a temperature-sensing unit and a controller. The amplifier unit comprises a power amplifier unit with an adjustable gain that is regulated by the controller. The controller may include a data processor and communication ports for communication between the controller and the temperature-sensing unit and between the controller and the power amplifier unit.

Advantageously, the temperature of the amplifier is fedback to control the applied amplifier power level. In case of an over temperature the amplifier system stills deliver a signal, although at a lower level than desired. If used by a disc jockey, he can react to that by choosing music that requires a lower power level until the amplifier system temperature reaches an appropriate level.

Other systems, methods, features and advantages of the invention will be, or will become, apparent to one with skill in the art upon examination of the following figures and detailed description. It is intended that all such additional systems, methods, features and advantages be included within this description, be within the scope of the invention, and be protected by the following claims.

DESCRIPTION OF THE DRAWINGS

The present invention can be better understood with reference to the following drawings and description. The components in the figures are not necessarily to scale, emphasis instead being placed upon illustrating the principals of the invention. Moreover, in the figures, like reference numerous designate corresponding parts throughout the different views.

DETAILED DESCRIPTION

Figure 1:
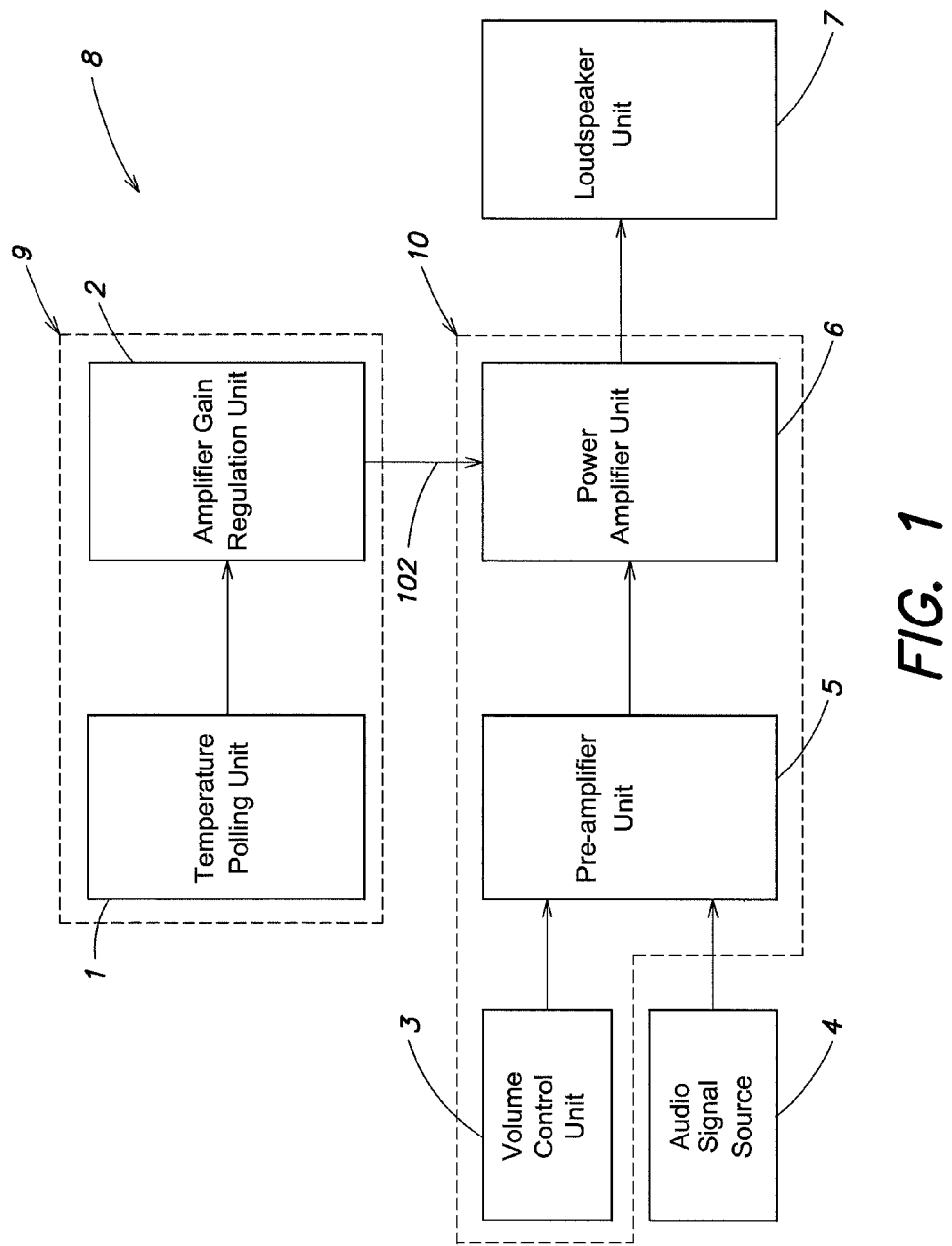
FIG. 1 is a block diagram illustration of a thermally regulated audio amplifier system.

The present invention provides feedback of the temperature of the amplifier system for control of the applied amplifier power level, where the thermally regulated amplifier system may include an amplifier unit, a temperature-sensing unit and a controller. The amplifier unit includes a power amplifier unit with an adjustable gain that is regulated by the controller. The controller may include a data processor and communication ports connected by a communication channel between the controller and the temperature-sensing unit and between the controller and the power amplifier unit.

The temperature sensing unit may sample the amplifier system temperature T(n) at fixed intervals and transmits the sampled amplifier system temperature T(n) reading to the controller. The data processor of the controller determines a gain G(n) of the power amplifier unit and sets the gain G(n) of the power amplifier unit to the gain G(n) of the power amplifier via the communication port that is between the controller and the power amplifier unit.

The thermally regulated amplifier system may also include a fan that operates when the amplifier system temperature T(n) exceeds a fan trigger temperature and stops operating when the amplifier system temperature T(n) is below the fan trigger temperature. Of course hystersis may be added to the thresholds as necessary.

For example, a technique for regulating an amplifier system temperature includes receiving a volume level setting V(n) from a user. Then an amplifier system temperature T(n) value is read by a temperature sensing unit at regular intervals. Following this, the amplifier system temperature T(n) is compared against a gain regulation temperature $T_{reg\_on}$. If the amplifier system temperature T(n) is below the gain regulation temperature $T_{reg\_on}$, then the gain G(n) of the power amplifier unit is adjusted to the gain level determined by the volume setting V(n). When the amplifier system temperature T(n) is above the gain regulation temperature $T_{reg\_on}$, the gain G(n) of the power amplifier unit is adjusted to a gain less than the gain level set by the volume setting V(n).

Further, operation of a fan for additional cooling may be provided if necessary, where it may be verified whether the amplifier system temperature T(n) is above a fan trigger temperature $T_{fan\_on}$. When the amplifier system temperature T(n) is above the fan trigger temperature $T_{fan\_on}$ then a fan is activated. The fan may be turned off when the amplifier system temperature T(n) is below the fan trigger temperature $T_{fan\_on}$.

Historical (e.g., stored) values of the amplifier system temperature T(n) may be used to choose the gain G(n) of a power amplifier unit when the amplifier system temperature T(n) is above the gain regulation temperature $T_{reg\_on}$.

A rate of change of the amplifier system temperature T(n) may be used to establish the gain G(n) of the power amplifier unit. A rapid change of the amplifier system temperature T(n) will suggest a large change in the gain G(n) of the power amplifier unit.

The two most recent amplifier system temperature T(n) readings may be used to compute the rate of change of the amplifier system temperature T(n). The use of the two most recent amplifier system temperature T(n) readings provide for a relatively easy computation of the rate of change of the amplifier system temperature T(n).

More than the two most recent amplifier system temperature T(n) reading may be used to compute the rate of change of the amplifier system temperature T(n). The use of larger number of temperature data points aids in preventing spurious amplifier system temperature data points from making abrupt change to the computed change of the amplifier system temperature T(n).

The historical gain G(n) of the power amplifier unit may also be used to compute the gain G(n) of the power amplifier unit. The use of the historical gain G(n) offers another source of information for the assessment of the gain G(n), in addition to or as an alternative to the historical data of the amplifier system temperature T(n).

In time-discrete operated systems, reading the values of the amplifier system temperature T(n) at regular intervals may facilitate the selection of the gain G(n) of a power amplifier.

The gain G(n) of the power amplifier unit may be computed in decibel units by the following equation:

$$G(n) = G(n-1) - c_d \left[ k_n T(n) - \sum_{x=1}^{x=a} k_{n-x} T(n-x) \right] \quad (1)$$

where,
$c_d$ comprises a constant value,
$k_n$ is a coefficient,
a, n comprises a integer value, and $2 \leq a$,
$k_{n-x} \prec k_{n-(x+1)}$ for $1 \leq x \leq a$, and $$k_n = \sum_{x=1}^{x=a} k_{n-x}$$

The restriction that $k_{n-x} \prec k_{n-(x+1)}$ for $1 \leq x \leq a$ gives greater weight to the earlier amplifier system temperature T(n) and prevents a more recent temperature T(n) reading from causing sudden changes to the G(n).

The condition that $$k_n = \sum_{x=1}^{x=a} k_{n-x}$$

causes the term $$\left[ k_n T(n) - \sum_{x=1}^{x=a} k_{n-x} T(n-x) \right]$$

of equation (1) to be zero when there is no rate of change of T(n). Thus the gain of the power amplifier G(n) of equation (1) remains constant when the temperature T(n) remains constant.

Regulation of the gain G(n) commences when the amplifier system temperature T(n) exceeds the gain regulation temperature $T_{reg\_on}$. When the regulation of G(n) commences, the T(n) is on the increase and this causes the term $$\left[ k_n T(n) - \sum_{x=1}^{x=a} k_{n-x} T(n-x) \right]$$

of equation (1) to be of positive value and the gain variable G(n) of equation (1) to be of a negative value. Hence the gain variable G(n) commences on a decreasing trend.

A negative number in decibel units will have a value between zero and one. When the gain G(n) of the power amplifier unit is adjusted to the computed gain G(n), the output of the power amplifier is reduced. This reduction in turn, deters the amplifier system temperature T(n) from rising.

The gain G(n) of the power amplifier may also be computed by the equations below where the gain G(n) is in units of decibel.

$$G_1(n) = G_1(n-1) - c_d \left[ k_n T(n) - \sum_{x=1}^{x=a} k_{n-x} T(n-x) \right] \quad (2)$$

where, $C_d$ comprises a constant value, $k_n$ is a coefficient, and a, n comprises a integer value, and $2 \leq a$, $$k_{n-x} \prec k_{n-(x+1)} \text{ for } 1 \leq x \leq a, \text{ and } k_n = \sum_{x=1}^{x=a} k_{n-x} \quad (3)$$

$$G_2(n) = G_2(n-1) + c_i [T_m - T(n)]$$

where, $c_i$ comprises a constant value, and $T_m$ is the upper temperature control limit of the amplifier system temperature reading T(n).

$$G(n)=G_1(n)+G_2(n) \quad (4)$$

Equations (1) and (2) are similar. From earlier comments on equation (1), one can see that the variable $G_1(n)$ starts with a decreasing rate.

The equation (3) shows a gain variable $G_2(n)$ that increases when the amplifier system temperature T(n) reading is below the upper temperature control limit $T_m$. When the regulation of the gain of G(n) commences, T(n) exceeds the gain regulation temperature $T_{reg\_on}$. Moreover, T(n) has a value that is below $T_m$. In view of this, the equation (3) shows that the gain variable $G_2(n)$ commences with a positive value and is on an increasing trend. The gain variable $G_2(n)$ can be viewed as the gain component, which acts to increase and restore G(n) back to a level that produces the desired volume level.

The values of the variables $G_1(n)$ and $G_2(n)$ may be set to zero decibel when $-G_1(n)<G_2(n)$. It may be the case that when the gain regulation of the power amplifier commences, the gain variable $G_1(n)$ has negative values and the gain variable $G_2(n)$ have positive values. This step restricts the computed gain G(n) of the power amplifier unit to having negative values or a value of zero. The computed gain G(n) of the power amplifier unit are preferably in units of decibel and will thus have an absolute value between zero and one. When the controller adjusts the gain of the power amplifier unit to the computed gain G(n), the output of the power amplifier unit will be reduced.

FIG. 1 shows a schematic block diagram of a thermally regulated audio amplifier system 8. The system 8 includes an amplifier thermal management unit 9 that comprises a temperature polling unit 1 and an amplifier gain-regulation unit 2. The output of the temperature-polling unit 1 is supplied to the amplifier gain-regulation unit 9, which supplies a signal on a line 102 to a power amplifier unit 6 within an amplifier unit 10. The amplifier unit 10 includes a volume control unit 3 and an audio pre-amplifier unit 5. The audio pre-amplifier unit 5 receives a signal from the volume control unit 3 and a signal from an audio signal source 4, and outputs a signal to the power amplifier unit 6. The power amplifier unit 6 in turn drives a loudspeaker unit 7.

In the present example, the temperature-polling unit 1 includes at least one temperature sensor (not shown) and senses the temperature of the audio amplifier system 8 at regular time intervals but also may, for example, continuously measure the temperature. The polled temperature reading is supplied to the amplifier gain-regulation unit 2 that computes the regulation-gain of the power amplifier unit 6. The volume control unit 3 receives a volume level setting from a user. The volume level setting is supplied to the audio pre-amplifier unit 5 which receives the audio signal from the audio signal source 4 and amplifies the audio signal by a factor corresponding to the volume level setting. The amplified audio signal is provided to the power amplifier unit 6 whose output power corresponds, accordingly, to the volume level setting as well as to the regulation-gain computed by the amplifier gain-regulation unit 2. When the power amplifier is unregulated, the gain of the power amplifier unit 6 may be set to one.

Figure 2:
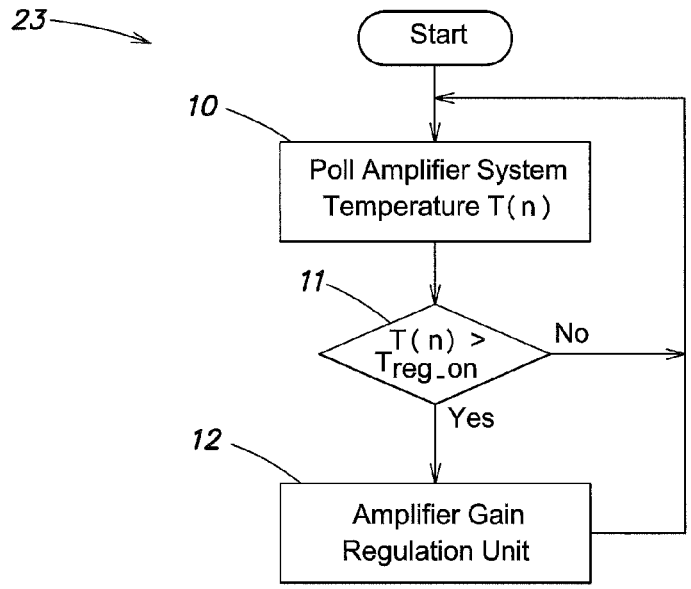
FIG. 2 is a flow chart outlining operation of an amplifier thermal management unit.

FIG. 2 illustrates a flow chart 23 outlining the operation of the amplifier thermal management unit 9. The flow chart 23 starts with the polling of an amplifier system temperature T(n) in regular time intervals in step 10. The polled amplifier system temperature T(n) reading is then compared against a regulation-start temperature $T_{reg\_on}$ in step 11. If T(n) is greater than $T_{reg\_on}$, amplifier gain-regulation then step 12 is then executed. If T(n) is not greater than $T_{reg\_on}$, the procedure again starts with step 10. Following step 12 the operation returns to step 10.

In the present example, the amplifier system temperature T(n) is polled every 20 seconds with a one degree Celsius (° C.) resolution. The amplifier gain-regulation unit 12 is activated when the amplifier system temperature T(n) exceeds the regulation start temperature $T_{reg\_on}$, which is set at 70° C. The regulation may, e.g., take place in two different manners. One way is to reduce the gain by or to one constant value when the regulation start temperature $T_{reg\_on}$ is exceeded. The other way is that the gain is reduced by or to a first constant value, and when the temperature still exceeds the regulation start temperature $T_{reg\_on}$, it is reduced by or to a second value and so on.

Figure 3:
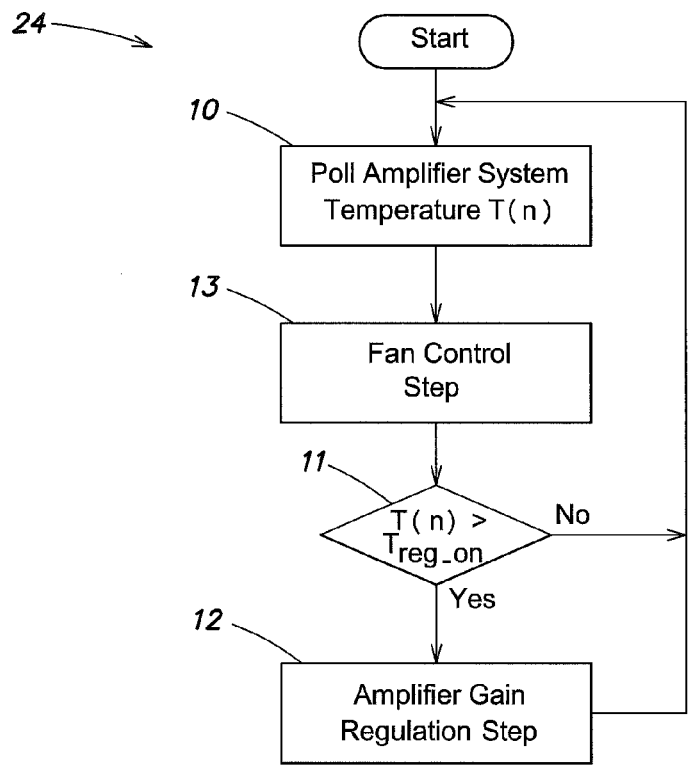
FIG. 3 illustrates a flow chart outlining operation of a further amplifier thermal management unit.

FIG. 3 illustrates a flow chart 24 outlining an alternative control routine. The flow chart 24 has steps similar to those shown in FIG. 2 where the difference between FIGS. 2 and 3 is the inclusion of a fan control step after the polling of the amplifier system temperature T(n) in step 10. The flow chart 24 again starts with the polling of an amplifier system temperature T(n) in step 10. A fan is activated in step 13 when a certain fan control temperature is exceeded by the temperature amplifier system temperature T(n). The fan control temperature may be higher or lower than the regulation-start temperature $T_{reg\_on}$. Following this, the amplifier system temperature T(n) is compared against a regulation-start temperature $T_{reg\_on}$ in the decision step 11.

Figure 4:
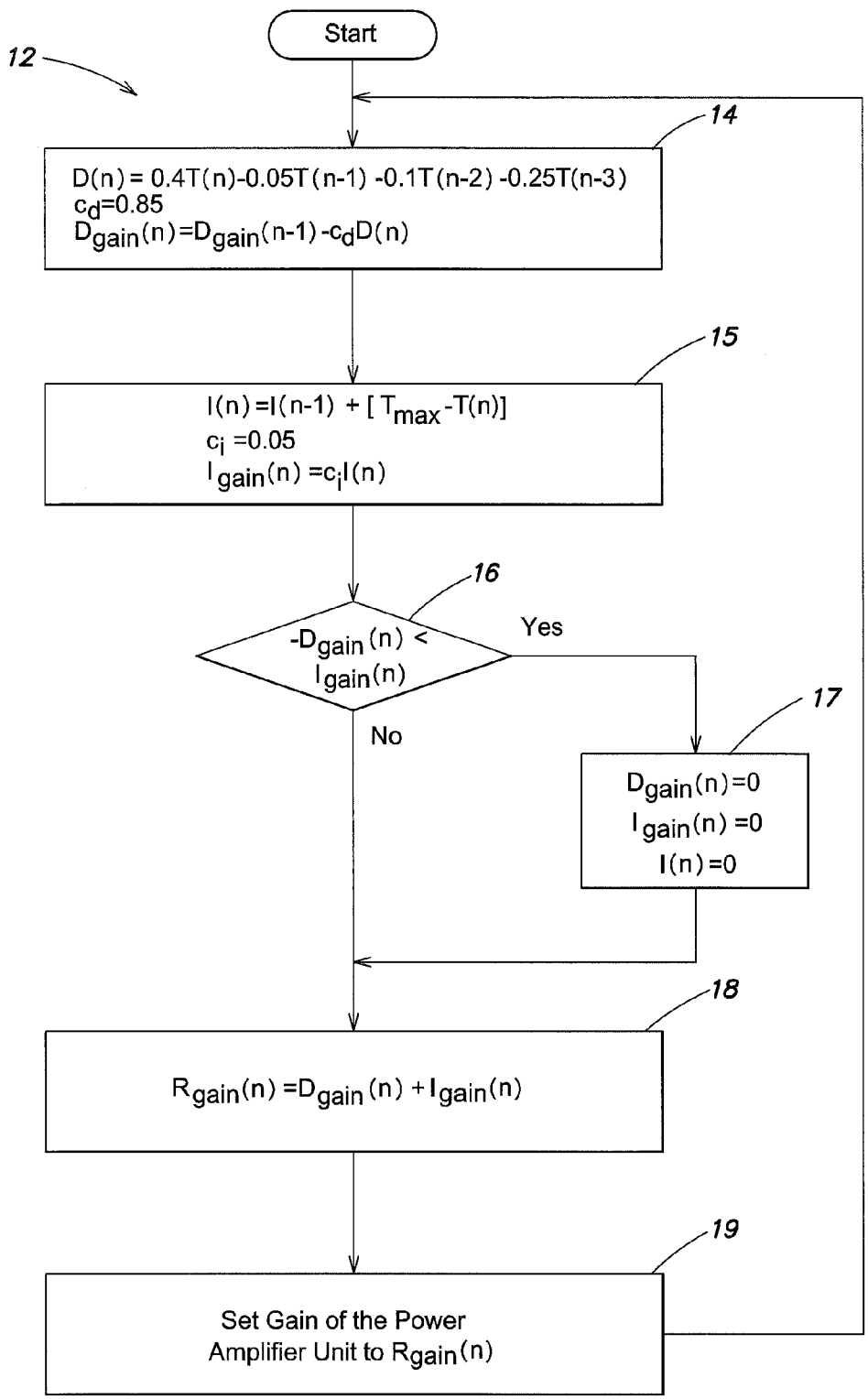
FIG. 4 illustrates a flow chart outlining operation of an amplifier gain-regulation unit used in the amplifier thermal management unit of FIGS. 2 and 3.

FIG. 4 illustrates a flow chart of the operation of an amplifier gain-regulation unit used for amplifier thermal management (see step 12) as outlined in FIGS. 2 and 3. The amplifier gain-regulation routine 12 starts with the computation of a DI-gain $D_{gain}(n)$ of the power amplifier (D=Differential, I=Integral), in step 14. $D_{gain}(n)$ may be computed with the equation below. The computed $D_{gain}(n)$ are in units of decibel.

$$D(n)=0.4T(n)-0.05T(n-1)-0.1T(n-2)-0.25T(n-3) \quad (5)$$

where, T(n) is a polled amplifier system temperature, and n is an integer and denotes the sequence number of the polled amplifier system temperature and has a value greater than 0.

$$D_{gain}(n)=D_{gain}(n-1)-c_d D(n) \quad (6)$$

where, ci is a constant $c_d$ and may have a value of, for example, 0.85.

The computation of I-gain $I_{gain}(n)$ of the amplifier is performed in step 15, for example, with the equations below. The computed $I_{gain}(n)$ are in units of decibel.

$$I(n)=I(n-1)+[T_{max}-T(n)] \quad (7)$$

where, $T_{max}$ is a regulation-maximum temperature and may have a value of, for example, 81° C.

$$I_{gain}(n)=c_i I(n) \quad (8)$$

where, ci is a constant and may have a value of, for example, 0.05.

After step 15, the negative value of the D-gain $D_{gain}(n)$ is compared against the value of the I-gain $I_{gain}(n)$ in decision step 16. If the negative value of the $D_{gain}(n)$ is less than the value of $I_{gain}(n)$ then the values of $D_{gain}(n)$, $I_{gain}(n)$ and variable I(n) will be set to zero decibel in step 17. After this, the regulation-gain $R_{gain}(n)$ of the amplifier is determined in step 18. $R_{gain}(n)$ is the sum of $D_{gain}(n)$ and $I_{gain}(n)$.

If the negative value of $D_{gain}(n)$ is not less than the value of $I_{gain}(n)$, then the next step is computation of $R_{gain}(n)$ in step 18. The next step 19 involves setting the gain of the power amplifier to the value of $R_{gain}(n)$.

Referring to equation (1), the computation of the variable D(n) is a measure of the rate of change of the amplifier system temperature reading T(n). The greater the rate of change of T(n), the greater the value D(n).

The value of D(n) is derived from the current system reading T(n) and the previous three weighted amplifier system temperature readings of T(n−1), T(n−2), and T(n−3). The earlier system reading is given greater weight than the later amplifier system temperature reading. This is to avoid generating steep changes to the DI-gain $D_{gain}(n)$.

The DI-gain $D_{gain}(n)$ as shown in equation (2), comprises of the sum of the previous DI-gain $D_{gain}(n-1)$ and the product of the negative value of the constant $c_d$ and of the variable D(n). When the rate of change of the amplifier system temperature reading T(n) is positive, the variable D(n) generated will be a positive number and the value of $D_{gain}(n)$ will decrease. Conversely, when the rate of change of T(n) is negative, the value of the variable D(n) derived will be a negative number and the value of $D_{gain}(n)$ will increase. If the temperature reading T(n) does not change over time, the value of the variable D(n) achieved is zero and the value of $D_{gain}(n)$ will stay unchanged.

FIGS. 2 and 3 show that the amplifier gain-regulation unit 12 is not operating when the amplifier system temperature T(n) has a value less than the regulation-start temperature $T_{reg\_on}$. When the temperature T(n) increases in value and exceeds $T_{reg\_on}$, the amplifier gain-regulation unit 12 will start to operate. Hence, when the amplifier gain-regulation unit 12 starts operating, the $D_{gain}(n)$ will start with a negative value as the variable D(n) has a positive value while the previous $D_{gain}(n-1)$ has a zero value. Moreover, the value of the $D_{gain}(n)$ is on a decreasing trend in the beginning since T(n) is on a increasing trend.

The value of the variable I(n) in equation (3) is a sum of the previous value of variable I(n−1) and the value of [$T_{max}$−T(n)]. The constant $T_{max}$ is the regulation-maximum temperature, which has for example a value of 81° C. In equation (4), the value of the I-gain $I_{gain}(n)$ comprises of the product of the constant $c_i$ and the variable I(n). The value of the constant $c_i$ is for example 0.05.

At the initial phase when the amplifier regulation unit starts to operate, the value of the amplifier system temperature T(n) will exceed the regulation start temperature $T_{reg\_on}$ and will have a value that is between the value of $T_{reg\_on}$ and the value of regulation-maximum temperature $T_{max}$. The I-gain $I_{gain}(n)$ thus starts with a positive value since the value of [$T_{max}$−T(n)] is a positive number and $I_{gain}(n-1)$ has a zero value. Furthermore, $I_{gain}(n)$ starts on an increasing trend as the value of [$T_{max}$−T(n)] is positive.

If the value of the amplifier system temperature T(n) reaches the regulation-maximum temperature $T_{max}$, then [$T_{max}$−T(n)] attains a zero value. If the temperature T(n) stays at $T_{max}$ then the value of $I_{gain}(n)$ will also stay unchanged.

The value of the DI-gain $D_{gain}(n)$ is dependent on the constant $c_d$, which for example has a value of 0.85. The value of the I-gain $I_{gain}(n)$ is dependent on the constant $c_i$, which has for example a value of 0.05. The small value of the constant $c_i$ relative to the value of the constant $c_d$ tends to keep the absolute value of $D_{gain}(n)$ more than the absolute value of $I_{gain}(n)$.

Referring still to FIG. 4, the value of the negative value of the DI-gain $D_{gain}(n)$ is compared with the I-gain $I_{gain}(n)$ in step 16. If the negative value of $D_{gain}(n)$ is less than the value of $I_{gain}(n)$, then the value of the $D_{gain}(n)$, the value of $I_{gain}(n)$ and the value of the variable I(n) are set to zero decibel in step 17. Hence the decision step 16 keeps the negative value of $D_{gain}(n)$ not less than the value of $I_{gain}(n)$ when the process flow reaches step 18.

The regulation gain $R_{gain}(n)$ is computed in step 18 and is the sum of the DI-gain $D_{gain}(n)$ and the I-gain $I_{gain}(n)$. The processing of step 16 thus ensures that the value of $R_{gain}(n)$ is either zero or less than zero. The gain of the power amplifier is set to the value of $R_{gain}(n)$ in step 19. A number of zero or less than zero in decibel units will have a value of either one or less than one.

Thus the amplifier regulation unit starts to operate when the amplifier system temperature T(n) exceeds the regulation-start temperature $T_{reg\_on}$. A rising amplifier system temperature T(n) will generate a lower gain for the power amplifier unit. In this manner thermal regulation of the amplifier system is achieved.

Figures 5, 6:
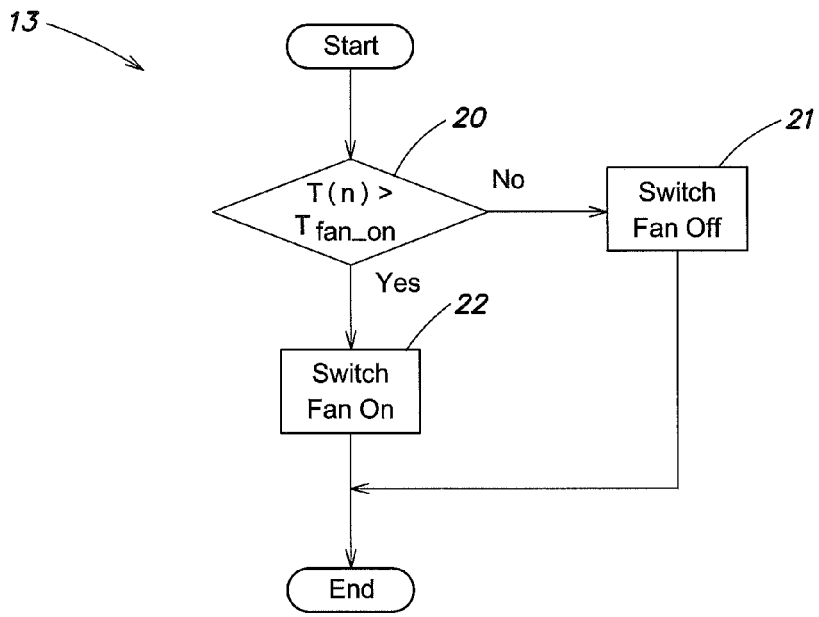
FIG. 5 illustrates a flow chart outlining operation of a fan control unit of the amplifier thermal management unit of FIG. 3.
FIG. 6 illustrates a table of power output values of the amplifier unit illustrated in FIG. 1.

FIG. 5 illustrates a flow chart of the fan control logic 13 of the amplifier thermal management unit of FIG. 3. The fan control logic 13 starts with the comparison of the amplifier system temperature T(n) with a fan-start temperature $T_{fan\_on}$ in step 20. If T(n) is greater than $T_{fan\_on}$, the fan is switched on in step 22. If T(n) is not greater than $T_{fan\_on}$, then the fan is switched off in step 21. The fan is operating when T(n) exceeds $T_{fan\_on}$.

FIG. 6 shows a table of output values, as an example, of the power amplifier unit 6 of the amplifier system of FIG. 1. For the first 2000 seconds, the amplifier is caused to produce 25 watts of power. The amplifier then outputs 8 watts for the next 1000 seconds. Thereafter, the amplifier gives out 0.8 watts for 4000 seconds. After this, the amplifier outputs 24 watts for 2000 seconds. Lastly, the amplifier generates 16 watts for 1000 seconds. The power values, times and threshold values are cited by way of example. One of ordinary skill in the art will recognize that these values of course change as part of the specific implementation details of a system incorporating the inventive close loop temperature control to provide a thermally regulated amplifier system.

The table of amplifier output values is used in the following figures merely as example. These power output values examples are for an amplifier in an unregulated state. When the amplifier is in a regulated state, the power output values as stated in the table are multiplied with a gain factor that is determined by the amplifier gain-regulation unit.

Figure 7:
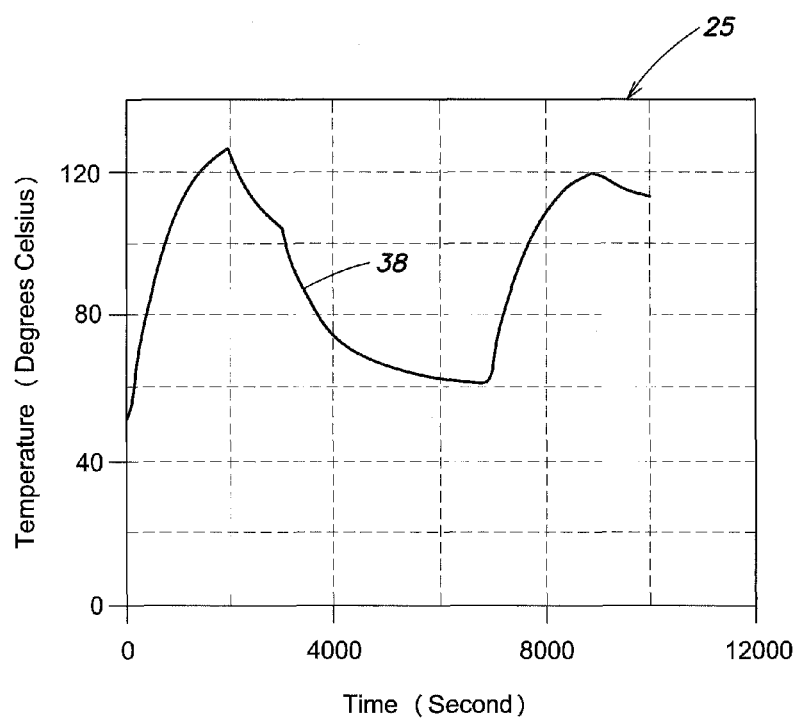
FIG. 7 illustrates a temperature graph of an unregulated amplifier system of the prior art.

FIG. 7 illustrates a temperature graph 25 of an unregulated amplifier system of the prior art. The unregulated amplifier system produces a power output value as shown in FIG. 6. The amplifier system temperature T(n) starts from an initial temperature of about 50° C. and rises to a peak temperature of about 128° C. after 2000 seconds. Then the amplifier system temperature T(n) decreases to about 104° C. at the 3000 second time point and then falls further to about 62° C. at the 7000 second time point before rising to about 120° C. at the 9000 second time point. Finally, the amplifier system temperature T(n) declines to about 114° C. at the 10,000 second time point.

During the operation of the prior art unregulated amplifier system, the amplifier system temperature T(n) reading fluctuates between a high of about 128° C. and a low of about 62° C. The amplifier system has a thermal resistance $R_{th}$ of 0.9° C. per watt, and a thermal capacitance $C_{th}$ of 855 joules per degree Celsius.

The graphs in FIGS. 8-11 plot different parameters of a regulated amplifier system 8. The regulated amplifier system 8 has the same thermal features as the unregulated amplifier system that generated the temperature versus time curve 38 in FIG. 7. The regulated amplifier system 8 has a thermal resistance $R_{th}$ of 0.9° C. per watt and a thermal capacitance $C_{th}$ of 855 joule per degrees Celsius. The thermal management unit 9 of the regulated amplifier system 8 has a regulation-start temperature $T_{reg\_on}$ of 70° C. and a regulation-maximum temperature $T_{max}$ of 81° C. When the amplifier system temperature T(n) is above $T_{reg\_on}$, the regulated amplifier system 8 produces the power output value as shown in FIG. 6. The regulated amplifier system 8 produces the power output value as shown in FIG. 6 multiplied by a regulation gain factor when temperature T(n) is below $T_{reg\_on}$. The amplifier gain-regulation unit 2 determines the regulation gain factor.

Figure 8:
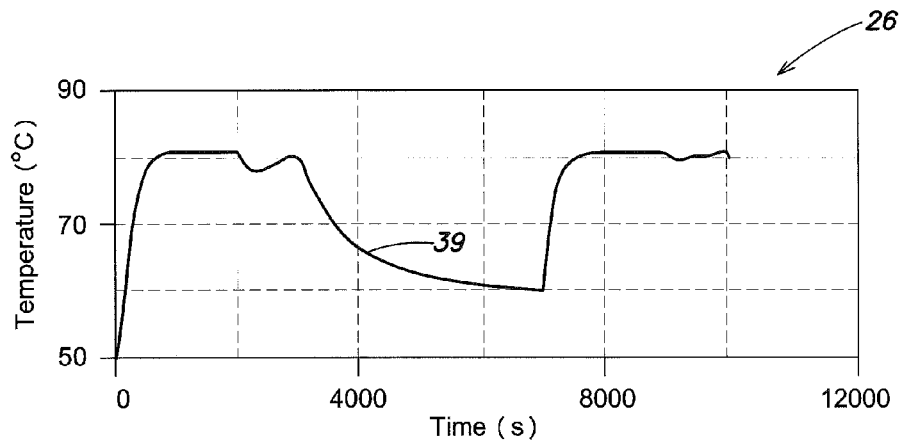
FIG. 8 illustrates a temperature graph of the regulated amplifier system of FIG. 1.

FIG. 8 illustrates a temperature graph 26 of the regulated amplifier system 8 of FIG. 1. The amplifier system temperature T(n) on line 39 starts with a temperature reading of about 50° C. at 0 second time point. The temperature T(n) then rises to about 70° C. at 300 second time point and continues to rise to about 81° C. at 840 second time point. From this time point onwards, the temperature T(n) reading remains roughly flat until about 2000 second time point. Then the temperature T(n) reading begins to decline to about 77° C. at 2300 second time point. After this time point, the temperature T(n) reading increases to about 80° C. at 3000 second time point. From the 3000 second time point onwards, the temperature T(n) readings falls to about 60° C. at 7000 second time point.

The amplifier system temperature T(n) starts to increase at the 7000 second time point to about 81° C. at 8000 second time point. From this time point onwards the temperature T(n) reading stays relatively constant until 9000 second time point. After the 9000 second time point, the temperature T(n) reading decreases slightly by about 1° C. at 9100 second time point and then increases around 1° C. at 10,000 second time point.

The amplifier gain-regulation unit 2 keeps the amplifier system temperature T(n) to a maximum reading of about 81° C. as an example in accordance to an aspect of the invention. In comparison, the temperature graph of an unregulated amplifier system in FIG. 7 under similar environment has a high temperature of about 128° C. The amplifier system temperature T(n) on the line 39 in FIG. 8 of the regulated amplifier does not show an overshoot over the temperature maximum limit of 81° C. There is no amplifier regulation when T(n) is below the regulation-start temperature $T_{reg\_on}$ of 70° C. When T(n) exceeds $T_{reg\_on}$, the amplifier gain-regulation unit 2 starts operating and the output of the power amplifier unit 6 is regulated.

Figure 9:
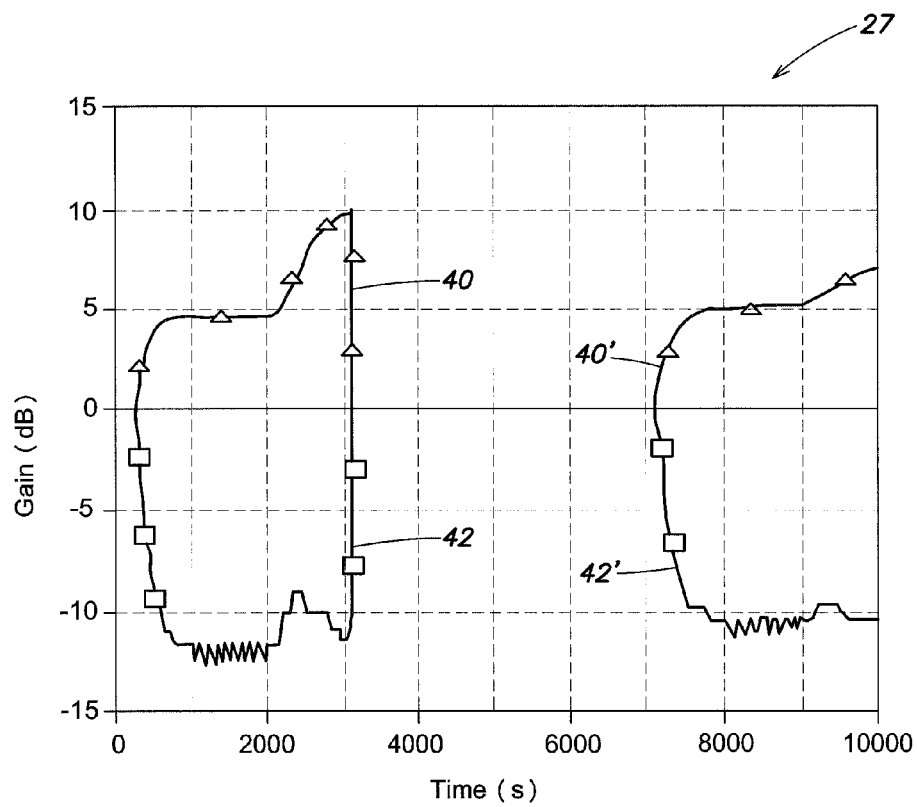
FIG. 9 illustrates a DI-gain and an I-gain graph of the regulated amplifier system of FIG. 1.

FIG. 9 illustrates a DI-gain and an I-gain graph 27 of the regulated amplifier system 8 of FIG. 1. The I-gain $I_{gain}(n)$ graph lines 42 and 42' have positive values while the DI-gain $D_{gain}(n)$ graph lines 40 and 40' contain negative values.

The DI-gain $D_{gain}(n)$ line 42 starts from a value of about 0 decibel (dB) at 300 second time point and falls to about −11.9 dB value at 840 second time point. The $D_{gain}(n)$ line 42 then remains mostly flat around the −11.9 dB value until 2000 second time point. At the 2000 second time point, the $D_{gain}(n)$ line 42 starts to increase from a value of about −11.9 dB to a value of about −8.7 dB at about 2300 second time point before falling to about −12.0 dB at 3000 second time point. Then the $D_{gain}(n)$ line 42 rises sharply to a value of about 0 dB at 3100 second time point.

At 7100 second time point, the $D_{gain}(n)$ line 42' starts from a value of about 0 dB and decreases to a value of about −11.0 dB at 8000 second time point. Line 42' stays mostly flat around the −11.0 dB value from the 8000 second time point to 9000 second time point. From the 9000 second time point, the $D_{gain}(n)$ line 42' begins to rise to a value of about −9.9 dB at 9100 second time point. Then the $D_{gain}(n)$ line 42' declines from a value of about −9.9 dB at the 9100 second time point to a value of about −11.0 dB at 10000 second time point $D_{gain}(n)$ graph lines 42 and 42' behave in agreement with the FIG. 4 description of the $D_{gain}(n)$. The $D_{gain}(n)$ lines 42 and 42' exhibit a positive slope from the 2000 second time point to the 2300 second time point and from the 9000 second time point to the 9100 second time point. When the $D_{gain}(n)$ has a positive slope, the corresponding amplifier system temperature T(n) line 39 in FIG. 8 has a negative slope.

Lines 42 and 42' are mostly constant from the 840 second time point to the 2000 second time point and from the 8000 second time point to the 9000 second time point. When $D_{gain}(n)$ is flat, the corresponding amplifier system temperature T(n) line 39 as shown in FIG. 8 also exhibits a constant reading.

From the 300 second time point to the 840 second time point and from the 2300 second time point to the 3000 second time point, line 42 shows a negative slope. Line 42' displays a negative slope from the 7100 second time point to the 8000 second time point and from the 9100 second time point to the 10000 second time point. When the DI-gain $D_{gain}(n)$ lines 42 and 42' show a negative slope, the corresponding amplifier system temperature T(n) in FIG. 8 shows a positive amplifier system temperature slope.

The I-gain $I_{gain}(n)$ line 40 begins with a value of 0 dB at about 300 second time point and then rises to a value of about 4.4 dB at 840 sec time point. From this time point onwards, the $I_{gain}(n)$ line 40 remains flat until about 2000 second time point. At the 2000 second time point, the $I_{gain}(n)$ line 40 begins to rise and reaches about 10 dB at 3000 second time point. The $I_{gain}(n)$ line 40 rises slightly by about 0.1 dB and then drops sharply to 0 dB at 3100 second time point.

The $I_{gain}(n)$ line 40' starts at 7100 second time point with a value of about 0 dB and rises to about 5.5 dB at 8000 second time point. Line 40' is constant at about 5.5 dB from the 8000 second time point to 9000 second time point. At the 9000 second time point, the line 40' starts to rise from a value of about 5.5 dB to a value of about 7.3 dB at the 10,000 second time point.

The behavior of $I_{gain}(n)$ graph lines 40 and 40' are in accordance with the FIG. 4 description of $I_{gain}(n)$. The amplifier system temperature T(n) exceeds 70° C. at about the 300 second time point and around the 7100 second time point. $I_{gain}(n)$ graph lines 40 and 40' commence at the time points where the amplifier system temperature T(n) exceeds 70° C.

Line 40 of the $I_{gain}(n)$ rises from the 300 second time point to the 840 second time points and from the 2000 second time point to the 3000 second time point. The $I_{gain}(n)$ line 40' rises from the 7100 second time point to the 8000 second time point and from the 9000 second time point to the 10,000 second time point. Lines 40 and 40' increase when the amplifier system temperature T(n) is below the regulation-maximum temperature $T_{max}$ of 81° C.

From the 840 second time point to the 2000 second time point and from the 8000 second time point to the 9000 second time point, the $I_{gain}(n)$ lines 40 and 40' are almost flat. The $I_{gain}(n)$ lines 40 and 40' are mostly constant when the amplifier system temperature T(n) has the same value as the regulation-start temperature $T_{reg\_on}$ of 81° C.

Figure 10:
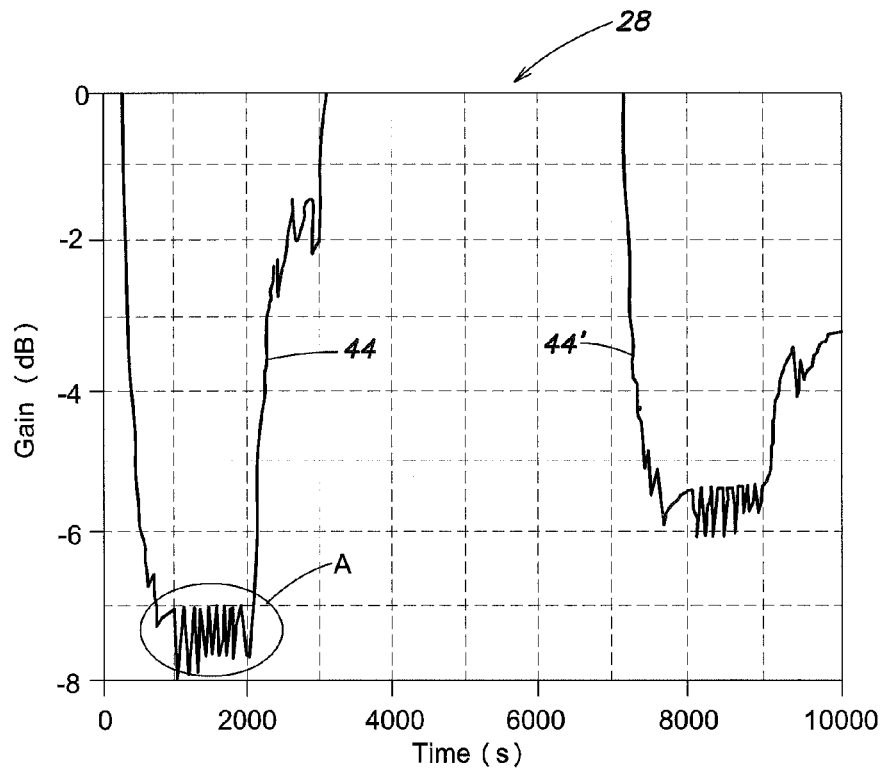
FIG. 10 illustrates a regulation gain graph of the regulated amplifier system of FIG. 1.

FIG. 10 illustrates a regulation gain graph 28 of the regulated amplifier system 8 of FIG. 1. The regulation-gain $R_{gain}(n)$ line 44 of the amplifier system starts at 0 dB at about 300 second time point and falls to about −7.5 dB at 840 second time point and then stays around −7.5 dB value until the 2000 second time point. From the 2000 second time point, the $R_{gain}(n)$ line 44 starts to rise to roughly −2.0 dB at 3000 second time point. At the 3000 second time point, the $R_{gain}(n)$ line 44 rises sharply to 0 dB at about 3100 second time point.

$R_{gain}(n)$ line 44' begins with a value of 0 dB at 7100 second time point and decreases to a value of about −5.5 dB at 8000 second time point. The $R_{gain}(n)$ line 44' then remains around a −5.5 dB value until 9000 second time point. From the 9000 second time point, the line 44' rises to about −3.5 dB at 9400 second time point. After that, the $R_{gain}(n)$ line 44' falls to about −4.0 dB at 9500 second time point. The $R_{gain}(n)$ line 44' then rises to about −3.7 dB at 10000 second time point.

Lines 44 and 44' illustrate the thermal regulation of the amplifier system 8 via the gain regulation of the power amplifier unit 6. The regulation-gain $R_{gain}$ is activated at the point when the amplifier system temperature T(n) exceeds the regulation-start temperature $T_{reg\_on}$ of 70° C. at the 300 second time point and at the 7100 second time point. The value of the $R_{gain}(n)$ starts to reduce at the 300 second time point and at the 7100 second time point when the amplifier system temperature T(n) is increasing. In similar manner, the value of $R_{gain}(n)$ also increases when T(n) starts to decrease in value at the 2000 second time point and 9000 second time point.

Figure 11:
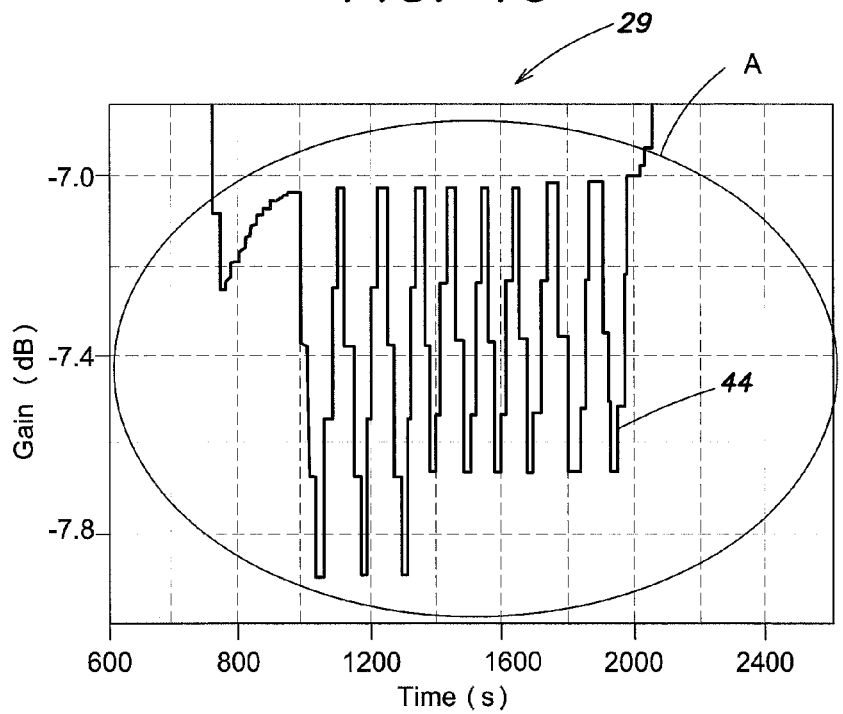
FIG. 11 illustrates an expanded view of section A illustrated in FIG. 10 of the regulation gain response of the regulated amplifier of FIG. 1.

FIG. 11 illustrates an expanded view of a section A of the regulation gain response of the regulated amplifier system 8 of FIG. 1. The time frame of the expanded view is from 760 second time point to 2040 second time point. Gain line 44 versus time starts from a value of about −6.9 dB at the 760 second time point and falls to a value of about −7.26 db at 770 second time point. The $R_{gain}(n)$ line 44 then rises from a value of about −7.26 dB at the 770 second time point to a value of about −7.03 db at 1000 second time point. From the 1000 second time point to the 1300 second time point, the $R_{gain}(n)$ line 44 fluctuates between about −7.03 db and about −7.65 db. And from the 1300 second time point to the 2000 second time point, the $R_{gain}(n)$ line 44 varies between about −7.0 dB and about −7.65 db.

The graphs in FIGS. 12-15 plot different parameters of an alternative regulated amplifier system. The distinction between the alternative regulated amplifier system and the regulated amplifier system is a fan control unit in the alternative regulated amplifier system. The fan control unit is activated with the system amplifier temperature T(n) exceeds a fan-start temperature $T_{fan\_on}$ of 68° C. The thermal resistance of the further amplifier system is of 0.4° C. per watt when the fan is activated and is of 0.9° C. per watt when the fan stops turning.

Figure 12:
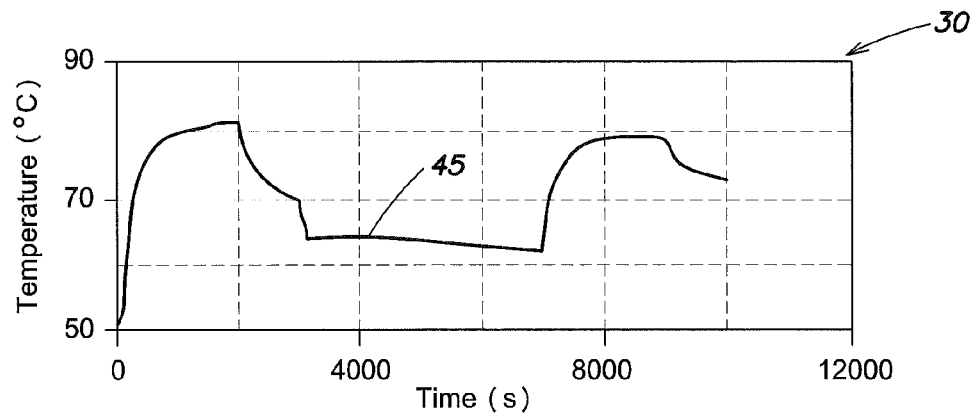
FIG. 12 illustrates a temperature graph of a further regulated amplifier system as that has fan control.

FIG. 12 illustrates a temperature graph 30 of a regulated amplifier system that has fan control. Line 45 of temperature graph 30 begins with a temperature reading of about 50° C. at 0 second time point and increases to around 81° C. at 2000 second time point. From around the 81° C. at the 2000 second time point, the line 45 drops to approximately 70° C. at the 3000 second time point. The line 45 decreases from about 70° C. at the 3000 second time point to around 64° C. at the 3130 second time point and then gently decline further to around 62° C. at the 7000 second time point.

At approximately 62° C. at the 7000 second time point, the temperature graph rises to about 79° C. at the 9000 second time point. Then the line 45 falls from approximately 79° C. at the 9000 second time point to around 73° C. at the 10,000 second time point.

The highest temperature reading on the line 45 is about 81° C., which is around the maximum control temperature limit $T_{max}$ of 81° C. Relative to temperature graph 26 of FIG. 8 of the regulated amplifier system, the temperature graph 30 has a slower rate increase from the 0 second time point to the 2000 seconds and from the 7000 second time point to the 9000 second time point. This is due to the lower thermal resistance of the alternative embodiment amplifier unit when the fan is activated. The fan is activated with the amplifier system temperature T(n) exceeds the fan-start temperature $T_{fan\_on}$ of for example 68° C. The line 45 has a gentle decline from the 3130 second time point to the 7000 second time point because the fan is not operating when the temperature T(n) is below the value $T_{fan\_on}$.

Figure 13:
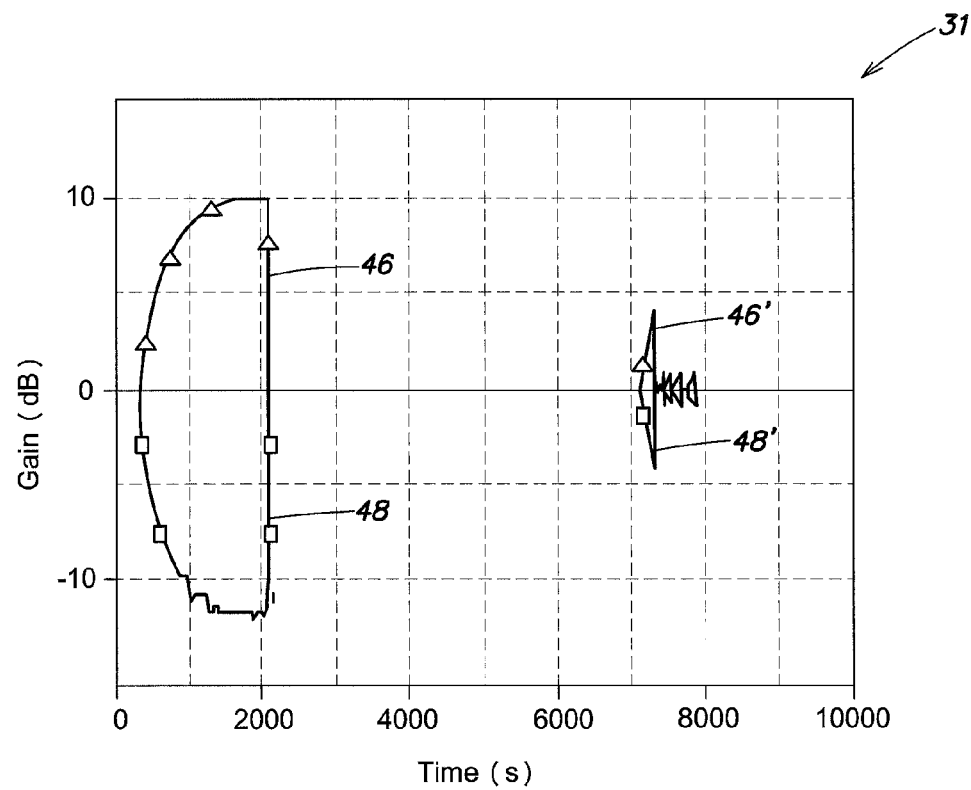
FIG. 13 illustrates an I-gain and a DI-gain graph of the further regulated amplifier system.

FIG. 13 illustrates an I-gain and a DI-gain graph 31 of the further regulated amplifier system. The I-gain graph includes lines 46 and 46', which have positive values. The DI-gain graph includes lines 48 and 48', which have negative values. I-gain line 46 of graph 31 starts with a value of 0 decibel (dB) at about 260 second time point and rises to about 10.4 dB at the 2050 second time point before falling steeply to 0 dB.

Beginning at the 7100 second time point, the I-gain line 46' has a value of 0 dB and ends with a value of 0 dB at 7870 second time point. The I-gain line 46' oscillates between a high value of about 4.0 dB and 0 dB. DI-gain line 48 starts at with a value of about 0 dB at the 260 second time point and decreases to about −11.6 dB before rising steeply to approximately 0 dB at 2050 second time point. The DI-gain line 48' begins at the 7110 second time point with a value of about 0 dB and swings between around 0 dB and about −4.1 dB. The graph line 48' stops at approximately 0 dB at 7870 second time point.

The I-gain lines have positive values and the DI-gain lines have negative values. The gain graphs starts when the amplifier system temperature exceed the regulation-start temperature $T_{reg\_on}$ of 70° C. The I-gain and DI-gain lines terminate at an earlier time point as compared with the same gain graph 27 of FIG. 9. This is due to a faster falling rate of the temperature line 45 of the alternative amplifier system temperature T(n) when the fan is operating.

Figure 14:
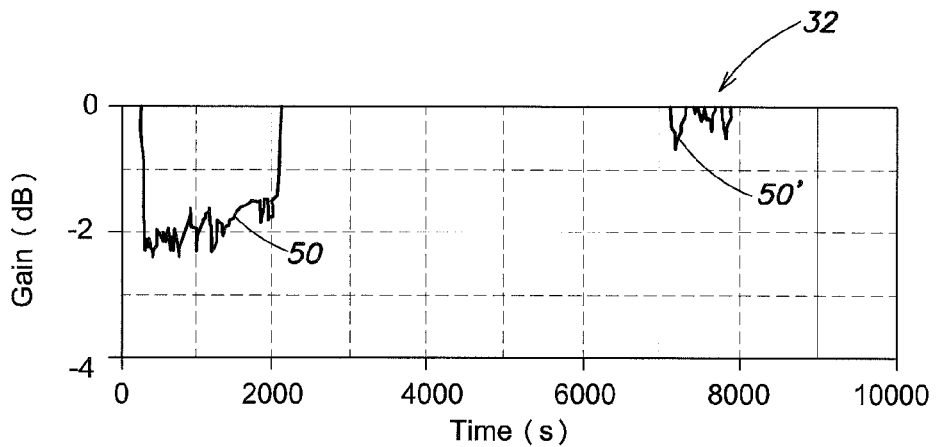
FIG. 14 illustrates a regulation gain graph of the further regulated amplifier system.

FIG. 14 illustrates a regulation gain graph 32 of the further regulated amplifier system. Regulation-gain $R_{gain}(n)$ line 50 of the graph 32 starts at about the 300 second time point with a value of 0 dB and stops at about the 2050 second time point with a value of 0 dB. Values on the line 50 vary between 0 dB and a low of about −2.4 dB.

From the 7100 second time point with a value of 0 dB, the $R_{gain}(n)$ line 50' of the graph 32 commences and ceases at about the 7870 second time point with a value of about 0 dB. Line 50' fluctuates between 0 and about −0.6 dB. The regulation-gain $R_{gain}(n)$ lines 50 and 50' begin when the amplifier system temperature T(n) exceeds the regulation-start temperature $T_{reg\_on}$ of 70° C. and according to an aspect of the invention has negative dB values. Lines 50 and 50' have smaller values as compared to regulation-gain $R_{gain}(n)$ lines 44 and 44' of graph 28 of the regulated amplifier system. This is due to the lower thermal resistance of the alternative embodiment amplifier system when the fan is activated.

Figure 15:
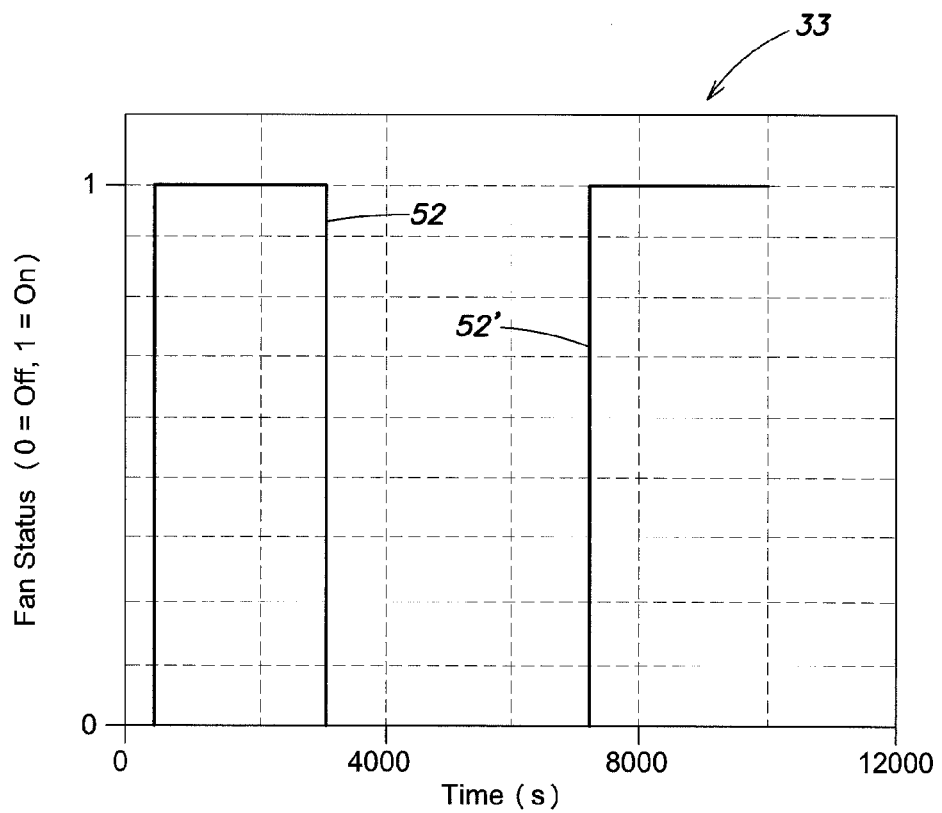
FIG. 15 illustrates a fan status graph of the further regulated amplifier system.

FIG. 15 shows a fan status graph 33 of the alternative regulated amplifier system. The fan is switched on from around the 310 second time point to about the 3040 second time point (see line 52) and from around the 7060 second time point to approximately 10,000 second time point (see line 52'). The fan is operating when the amplifier system temperature T(n) exceeds fan-start temperature $T_{fan\_on}$ of 68° C. When the amplifier system temperature T(n) drops below the fan-start temperature $T_{fan\_on}$ the fan is switched off.

FIGS. 16-19 illustrate the system operation under different conditions. The figures are temperature graphs generated by yet another thermally regulated amplifier system according to an aspect of the invention that includes a different heat dissipation feature for each temperature graph. This regulated amplifier system generates the power with a power output value that is shown in the table in FIG. 6 multiplied by an amplifier regulation gain $R_{gain}(n)$. The amplifier regulation gain $R_{gain}(n)$ is determined by the amplifier regulation unit 2.

Figure 16:
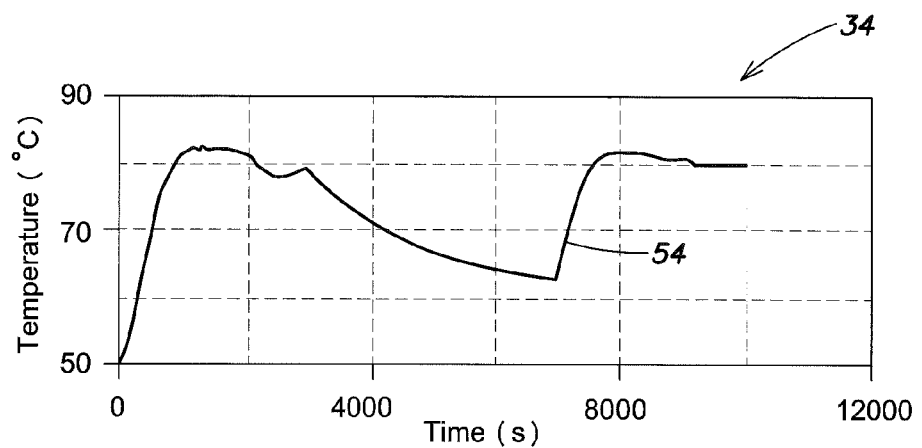
FIG. 16 illustrates a temperature graph of still a further regulated amplifier system, which comprises a large mass heat sink.

FIG. 16 shows a temperature graph 34 of a regulated amplifier system, that includes a large mass heat sink. The distinction with the regulated amplifier system and the regulated amplifier system that produced temperature graph 26 of FIG. 8 is in their thermal capacitance. The embodiment of the regulated amplifier system has a thermal capacitance of 1600 joule per degree Celsius, while the regulated amplifier system has a thermal capacitance of 855 joule per degree Celsius.

The temperature line 54 of graph 34 has an initial temperature of around 50° C. and rises to about 83° C. at the 1250 second time point before dipping by around 2° C. at the 2000 second time point. At the 2000 second time point, the line 54 then dips further from about 81° C. to around 78° C. at the 2500 second time point prior to rising to about 80° C. at 3000 second time point. Then the graph line 54 falls to approximately 63° C. at the 7000 second time point.

Thereafter, the graph line 54 rises from approximately 63° C. at the 7000 second time point to about 82° C. at the 8000 second time point before dipping by about 1° C. at the 9000 second time point. Then the line 54 falls from around 81° C. at the 9000 second time point to about 80° C. at the 9100 second time point. After this, the graph line 54 remains at approximately 80° C. from the 9100 second time point to the 10,000 second time point.

The temperature graph line 54 of the further amplifier system, having the large mass heat sink, has a maximum temperature around the maximum temperature limit $T_{max}$ of for example 81° C. In comparison with the temperature graph line 39 of FIG. 8 of the regulated amplifier system, the temperature graph line 54 has a slower rise and slower fall time. These are due to the large thermal capacitance of the further amplifier system.

Figure 17:
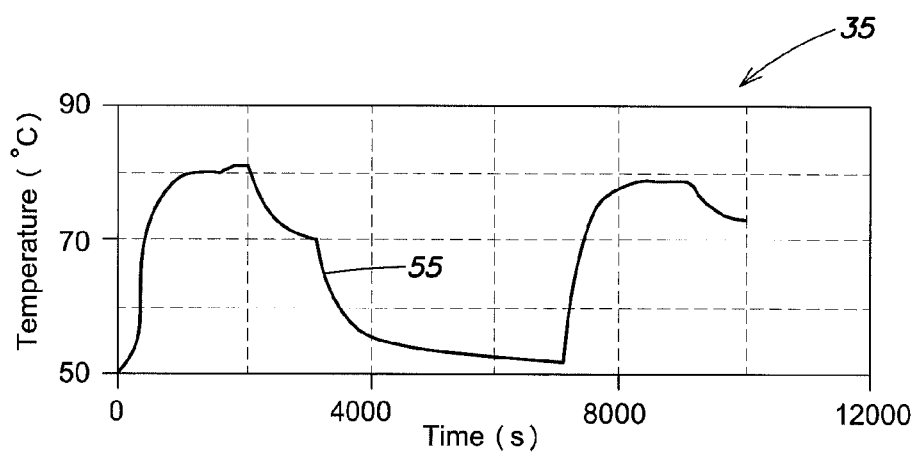
FIG. 17 illustrates a temperature graph of still a further regulated amplifier system, which comprises a good thermal heat sink.

FIG. 17 illustrates a temperature graph 35 of still a further regulated amplifier system, which comprises a good thermal heat sink. Between the further regulated amplifier system, which comprises a good thermal heat sink and the regulated amplifier system 8 that generated the temperature graph line 39 of FIG. 8, the distinction is in the thermal resistance $R_{th}$. The further regulated amplifier system, which includes a good thermal heat sink, has a thermal resistance $R_{th}$ of 0.4° C. per watt due to the good thermal heat sink while the regulated amplifier system has an $R_{th}$ of 0.9° C. per watt.

The line 55 of temperature graph 35 starts with a temperature of around 50° C. and rises to about 81° C. at the 2000 second time point. Then the line 55 decreases to approximately 70° C. at the 3000 second time point. After the 3000 second time point, the line 55 declines further from around 70° C. to about 51° C. at the 7000 second time point. From the 7000 second time point, the line 55 rises from approximately 51° C. to roughly 79° C. at 9000 second time point. The line 55 then falls to approximately 72° C. at the 10,000 second time point.

The maximum temperature of temperature line 55 is around the regulation-maximum temperature $T_{max}$ of 81° C. The line 55 has a temperature peak of for example around 81° C. at the 2000 second time point and a temperature peak of about 79° C. at the 9000 second time point. Relative to temperature line 39 of the regulated amplifier system, the temperature line 55 shows a fast heat dissipation rate from the 2000 second time point to the 7000 second time point and from the 9000 second time point to the 10,000 second time point. This is as one expects from a regulated amplifier system that has a good thermal heat sink.

Figure 18:
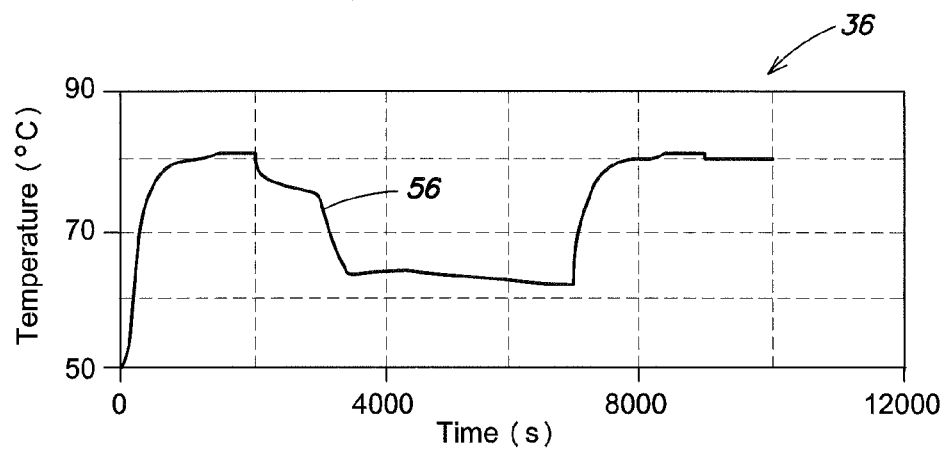
FIG. 18 illustrates a temperature graph of still a further regulated amplifier system, which comprises a fan control.

FIG. 18 illustrates a temperature graph 36 of still yet another embodiment of a regulated amplifier system, which comprises a fan control unit. The regulated amplifier system that includes a fan control unit of this embodiment has thermal parameters similar to that of the regulated amplifier system that generated the temperature graph line 39 of FIG. 8. A primary distinction between the two amplifier systems is that the former amplifier system has a thermal resistance $R_{th}$ of 0.9° C. per watt when the fan is not operating and a thermal resistance $R_{th}$ of 0.5° C. per watt when the fan is operating. The fan is operating when the amplifier system temperature T(n) exceeds a fan-start temperature $T_{fan\_on}$ of 68° C.

The temperature graph 36 comprises a line 56 that starts at about 50° C. at 0 second time point and rises to approximately 81° C. at the 2000 second time point. The line 56 then dips from about 81° C. at the 2000 second time point to around 76° C. at the 3000 second time point. Then line 56 declines further to around 64° C. at the 3420 second time point. After the 3420 second time point, the line 56 decreases at a slower rate to approximately 62° C. at the 7000 second time point.

The line 56 then increases from about 62° C. at the 7000 second time point to around 81° C. at the 9000 second time point. After the 9000 second time point, the line 56 falls from approximately 81° C. by around 1° C. at the 9200 second time point. The line 56 then remains around the 80° C. level until the 10,000 second time point. The further regulated amplifier system, which comprises a fan control unit, regulates the temperature peak, in accordance the invention, to approximately 81° C. at the 2000 second time point as well as at the 9000 second time point. Line 56 displays a slower temperature decline rate from the 3420 second time point to the 7000 second time point than the temperature decline from the 3000 second time point to the 3420 second time point. This is because the thermal resistance of the amplifier system is higher when the fan is switched off from the 3420 second time point to the 7000 second time point. The line 56 exhibits a fast temperature decline rate from the 2000 second time point to the 3000 second time point in comparison with the same period for temperature line 39 in FIG. 8. This is due to the lower thermal resistance of the further amplifier system when the fan is operating. The fan is operating when the amplifier system temperature T(n) of the further amplifier system is above 68° C.

Figure 19:
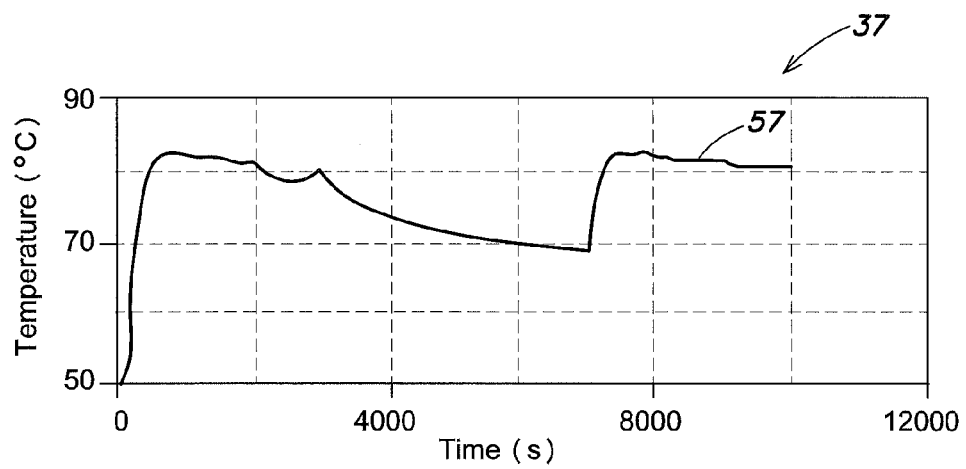
FIG. 19 illustrates a temperature graph of still a further regulated amplifier system, which comprises a poor thermal heat sink.

FIG. 19 illustrates a temperature graph 37 of still a another regulated amplifier system, which comprises a poor thermal heat sink. Due to its poor thermal heat sink, the amplifier system has a high thermal resistance $R_{th}$ of 1.2° C. per watt. Other features of the amplifier are similar with the regulated amplifiers system that generated the temperature graph line 39 of FIG. 8.

The line 57 of temperature graph 37 has a starting point of about 50° C. at 0 time point and rises to around 83° C. at 850 second time point before falling slightly by about 1° C. at the 2000 second time point. The temperature then dips further from around 82° C. to approximately 78° C. at the 2500 second time point before rising to about 80° C. at the 3000 second time point. Then the line 57 decreases to around 68° C. at the 7000 second time point.

At the 7000 second time point, the temperature increases from around 68° C. to approximately 83° C. at the 7350 second time point prior to dipping by about 1° C. at the 9000 second time point. From a temperature in the region of 82° C. at the 9000 second time point, the temperature graph line 57 decreases by about 2° C. to around 80° C. at the 9050 second time point and remains around this 80° C. point until the 10,000 second time point.

There is a temperature peak of for example about 83° C. between the 0 second time point and the 2000 second time point as well as between the 7000 second time point and the 9000 seconds time. This is due to the temperature control keeping the maximum temperature of the further regulated amplifier system to around $T_{max}$ of for example 81° C. The line 57 has a temperature of about 68° C. at the 7000 second time point. This temperature reading is about 8° C. higher than the same time point on line 39 of FIG. 8 and is due to the poor thermal sink of the further regulated amplifier system.

Although examples of the invention have been described herein above in detail, it is desired to emphasis that this has been for the purpose of illustrating the invention and should not be considered as necessarily limitative of the invention, it being understood that many modifications and variations can be made by those skilled in the art while still practicing the invention claims herein.

What is claimed is:

1. A method for regulating an amplifier system temperature $T(n)$ of an amplifier system, where the amplifier system comprises a volume control unit for inputting a listener's volume level setting $V(n)$, a temperature sensing unit for measuring the amplifier system temperature $T(n)$, a power amplifier unit having an adjustable gain $G(n)$, and a controller connected to the volume control unit, the temperature sensing unit, and the power amplifier unit, the method comprising:
receiving the volume level setting $V(n)$ from the volume control;
transmitting the amplifier system temperature $T(n)$ from the temperature sensing unit to the controller;
assessing whether the amplifier system temperature $T(n)$ is greater than a gain regulation temperature $T_{reg\_on}$;
adjusting the gain $G(n)$ of the power amplifier unit to a target gain level determined by the volume setting $V(n)$ if the amplifier system temperature $T(n)$ is below the gain regulation temperature $T_{reg\_on}$, or adjusting the gain $G(n)$ of the power amplifier unit to a target gain level between zero and the gain level determined by the volume setting $V(n)$ if the amplifier system temperature $T(n)$ is above the gain regulation temperature $T_{reg\_on}$; and
using historical values of the amplifier system temperature $T(n)$ for calculating the target gain $G(n)$ of the power amplifier unit if the amplifier system temperature $T(n)$ is above the gain regulation temperature $T_{reg\_on}$.

2. A method for regulating an amplifier system temperature $T(n)$ of an amplifier system, where the amplifier system comprises a volume control unit for inputting a listener's volume level setting $V(n)$, a temperature sensing unit for measuring the amplifier system temperature $T(n)$, a power amplifier unit having an adjustable gain $G(n)$, and a controller connected to the volume control unit, the temperature sensing unit, and the power amplifier unit, the method comprising:
receiving the volume level setting $V(n)$ from the volume control;
transmitting the amplifier system temperature $T(n)$ from the temperature sensing unit to the controller;
assessing whether the amplifier system temperature $T(n)$ is greater than a gain regulation temperature $T_{reg\_on}$;
adjusting the gain $G(n)$ of the power amplifier unit to a target gain level determined by the volume setting $V(n)$ if the amplifier system temperature $T(n)$ is below the gain regulation temperature $T_{reg\_on}$, or adjusting the gain $G(n)$ of the power amplifier unit to a target gain level between zero and the gain level determined by the volume setting $V(n)$ if the amplifier system temperature $T(n)$ is above the gain regulation temperature $T_{reg\_on}$; and
using a rate of change of the amplifier system temperature $T(n)$ for calculating the target gain $G(n)$ of the power amplifier unit.

3. The method of claim 2, where the amplifier system temperature $T(n)$ is assessed in time intervals readings, the method further comprising the step of using the two most recent amplifier system temperature readings $T(n)$ to compute the rate of change of the amplifier system temperature $T(n)$.

4. The method of claim 2, further comprising reading the values of the amplifier system temperature $T(n)$ at regular intervals.

5. The method of claim 4, further comprising computing the target gain $G(n)$ of the power amplifier unit based upon the following equation:

$$G(n) = G(n-1) - c_d \left[ k_n T(n) - \sum_{x=1}^{x=a} k_{n-x} T(n-x) \right] \quad (1)$$

where,
the value of $G(n)$ is in units of decibel,
$c_d$ comprises a constant value,
$k_n$ is a coefficient,
a, n comprises a integer value,
$2 \leq a$,
$k_{n-x} \prec k_{n-(x+1)}$ for $1 \leq x \leq a$, and $$k_n = \sum_{x=1}^{x=a} k_{n-x}.$$

6. The method of claim 4, further comprising computing the target gain $G(n)$ of the power amplifier unit based upon the following equation:

$$G_1(n) = G_1(n-1) - c_d \left[ k_n T(n) - \sum_{x=1}^{x=a} k_{n-x} T(n-x) \right]$$

where,
the value of $G_1(n)$ is in units of decibel,
$c_d$ comprises a constant value
$k_n$ is a coefficient,
a, n comprises a integer value,
$2 \leq a$, $$k_{n-x} \prec k_{n-(x+1)} \text{ for } 1 \leq x \leq a, \text{ and } k_n = \sum_{x=1}^{x=a} k_{n-x}$$

$$G_2(n) = G_2(n-1) + c_i [T_m - T(n)],$$

where,
the value $G_2(n)$ is in units of decibel,
$c_i$ comprises a constant value, and
$T_m$ is the upper temperature control limit of the amplifier system temperature reading $T(n)$, and $$G(n) = G_1(n) + G_2(n).$$

7. The method of claim 6, further comprising the step of setting the values of $G_1(n)$ and $G_2(n)$ to zero decibel when $-G_1(n) < G_2(n)$.

8. A method for regulating an amplifier system temperature $T(n)$ of an amplifier system, where the amplifier system comprises a volume control unit for inputting a listener's volume level setting $V(n)$, a temperature sensing unit for measuring the amplifier system temperature T(n), a power amplifier unit having an adjustable gain G(n), and a controller connected to the volume control unit the temperature sensing unit, and the power amplifier unit, the method comprising:

receiving the volume level setting V(n) from the volume control;

transmitting the amplifier system temperature T(n) from the temperature sensing unit to the controller;

assessing whether the amplifier system temperature T(n) is greater than a gain regulation temperature $T_{reg\_on}$; and adjusting the gain G(n) of the power amplifier unit to a target gain level determined by the volume setting V(n) if the amplifier system temperature T(n) is below the gain regulation temperature $T_{reg\_on}$, or adjusting the gain G(n) of the power amplifier unit to a target gain level between zero and the gain level determined by the volume setting V(n) if the amplifier system temperature T(n) is above the gain regulation temperature $T_{reg\_on}$; and using more than the two most recent amplifier system temperature readings T(n) to compute the rate of change of the amplifier system temperature T(n).

9. A method for regulating an amplifier system temperature T(n) of an amplifier system, where the amplifier system comprises a volume control unit for inputting a listener's volume level setting V(n), a temperature sensing unit for measuring the amplifier system temperature T(n), a power amplifier unit having an adjustable gain G(n), and a controller connected to the volume control unit, the temperature sensing unit, and the power amplifier unit, the method comprising:

receiving the volume level setting V(n) from the volume control;

transmitting the amplifier system temperature T(n) from the temperature sensing unit to the controller;

assessing whether the amplifier system temperature T(n) is greater than a gain regulation temperature $T_{reg\_on}$; and adjusting the Gain G(n) of the power amplifier unit to a target gain level determined by the volume setting V(n) if the amplifier system temperature T(n) is below the gain regulation temperature $T_{reg\_on}$, or adjusting the gain G(n) of the power amplifier unit to a target gain level between zero and the gain level determined by the volume setting V(n) if the amplifier system temperature T(n) is above the gain regulation temperature $T_{reg\_on}$; and using the historical values of the gain G(n) of the power amplifier unit to compute the target gain G(n) of the power amplifier unit.

10. A method of operating an amplifier system comprising an amplifier unit, a temperature sensor and a volume control unit, the method comprising:

running the amplifier system with a desired volume level V(n);

reading temperature of the amplifier system T(n);

verifying whether the temperature of the amplifier system T(n) is above a gain regulation temperature $T_{reg\_on}$;

adjusting volume of the amplifier system V(n) to a level between zero and a desired volume level when the temperature of the amplifier system T(n) is above the gain regulation temperature $T_{reg\_on}$; and using historical temperature readings of the amplifier system T(n) to choose the volume setting of the amplifier system V(n) when the temperature of the amplifier system T(n) is above the gain regulation temperature $T_{reg\_on}$.

11. The method of claim 10, further comprising using the rate of change of the temperature of the amplifier system T(n) to choose the volume setting of the amplifier system V(n).

12. The method of claim 11, further comprising using the two most recent temperature readings T(n) of the amplifier system to compute the rate of change of the temperature of the amplifier system T(n).

13. The method of claim 12, further comprising using more than two of the most recent temperature readings T(n) of the amplifier system to compute the rate of change of the temperature of the amplifier system T(n).

14. The method of claim 13, further comprising using the historical volume setting of the amplifier system V(n) to compute the volume setting of the amplifier system V(n).

15. The method of claim 11, further comprising reading the temperature of the amplifier system T(n) at regular intervals.

16. The method of claim 15, further comprising:

computing the volume setting of setting of the amplifier system unit based upon the following equation $$G(n) = G(n-1) - c_d \left[ k_n T(n) - \sum_{x=1}^{x=a} k_{n-x} T(n-x) \right]$$

where,
the value of G(n) is in units of decibel,
$c_d$ comprises a constant value,
$k_n$ is a coefficient,
a, n comprises a integer value,
$2 \leq a$, $$k_{n-x} < k_{n-(x+1)} \text{ for } 1 \leq x \leq a, \text{ and } k_n = \sum_{x=1}^{x=a} k_{n-x} \text{ and}$$

setting the volume setting of the amplifier system V(n) to the desired volume setting multiplied by the computed G(n).

17. The method of claim 15, further comprising computing the volume setting of setting of the amplifier system unit based upon the following equation:

$$G_1(n) = G_1(n-1) - c_d \left[ k_n T(n) - \sum_{x=1}^{x=a} k_{n-x} T(n-x) \right]$$

where,
the value of $G_1(n)$ is in units of decibel,
$c_d$ comprises a constant value,
$k_n$ is a coefficient,
a, n comprises a integer value,
$2 \leq a$, $$k_{n-x} < k_{n-(x+1)} \text{ for } 1 \leq x \leq a, \text{ and } k_n = \sum_{x=1}^{x=a} k_{n-x}$$

$$G_2(n) = G_2(n-1) + c_i [T_m - T(n)]$$

where,
the value of $G_2(n)$ is in units of decibel,
$c_i$ comprises a constant value, and $T_m$ is the upper temperature control limit of the amplifier system temperature reading $T(n)$, $G(n)=G_1(n)+G_2(n)$, and setting the volume setting of the amplifier system $V(n)$ to the desired volume setting multiplied by the computed $G(n)$.

18. The method of claim 17, further comprising setting the values of $G_1(n)$ and $G_2(n)$ to zero decibel when $-G_1(n)<G_2(n)$.

* * * * *